(12) United States Patent
Hoppe et al.

(10) Patent No.: US 7,565,636 B2
(45) Date of Patent: *Jul. 21, 2009

(54) SYSTEM FOR PERFORMING VERIFICATION OF LOGIC CIRCUITS

(75) Inventors: Bodo Hoppe, Ingershein (DE); Christoph Jaeschke, Tuebingen (DE); Johannes Koesters, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/060,953

(22) Filed: Apr. 2, 2008

(65) Prior Publication Data

US 2008/0216030 A1 Sep. 4, 2008

Related U.S. Application Data

(62) Division of application No. 11/461,469, filed on Aug. 1, 2006, now Pat. No. 7,398,494.

(30) Foreign Application Priority Data

Aug. 30, 2005 (EP) .................. 05107941

(51) Int. Cl.
*G06F 17/50* (2006.01)
(52) U.S. Cl. .................... 716/5; 716/3; 716/4
(58) Field of Classification Search ............ 715/3, 715/4, 5; 716/4, 5
See application file for complete search history.

(56) References Cited

U.S. PATENT DOCUMENTS

| | | | |
|---|---|---|---|
| 5,452,239 A | 9/1995 | Dai et al. |
| 5,493,508 A | 2/1996 | Dangelo et al. |
| 6,145,117 A | 11/2000 | Eng |
| 6,190,433 B1 | 2/2001 | Van Fleet et al. |
| 6,591,400 B1 | 7/2003 | Yang |
| 7,213,220 B2 | 5/2007 | Hoppe et al. |
| 2004/0107409 A1 | 6/2004 | Melham et al. |
| 2005/0138586 A1 | 6/2005 | Hoppe et al. |

*Primary Examiner*—Sun J Lin
(74) *Attorney, Agent, or Firm*—Lynn L. Augspurger; Steven Chiu

(57) ABSTRACT

The present invention relates to a system for verifying the proper operation of a digital logic circuit and program product therefore. In order to add a useful alternative in the field of functional, exhaustive simulation and of symbolic simulation, it is proposed to perform the steps of:

Figure 4:
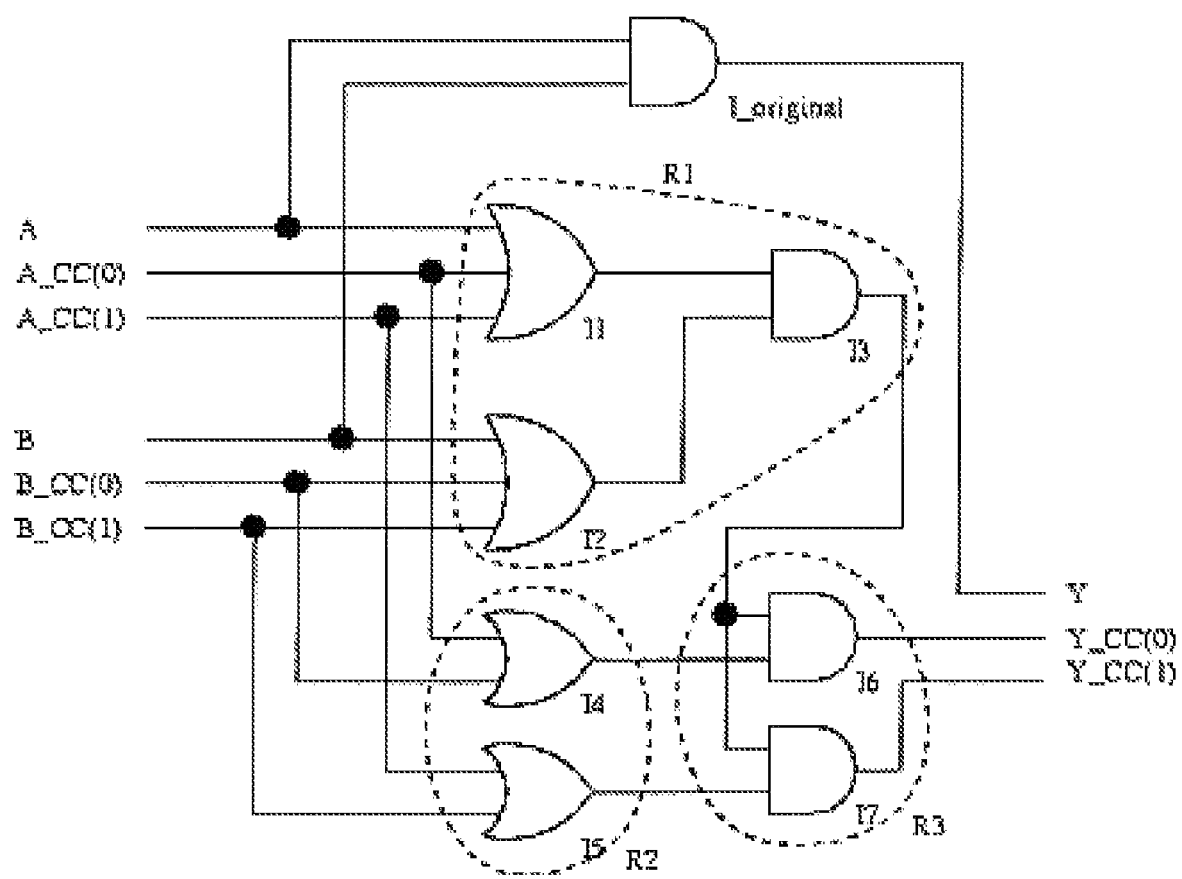

a) marking a net with an additional property other than a bit value, wherein both said bit value and said additional property are valid at said net at a given time;

b) propagating the marking of the net according to a set of predetermined semantic rules, wherein the set of predetermined semantic rules are defined according to a predetermined simulation; and c) generating an output at a predetermined downstream location of the digital logic circuit, said output providing an information, if or if not said property has propagated through the circuit to said predetermined downstream location or not.

3 Claims, 3 Drawing Sheets

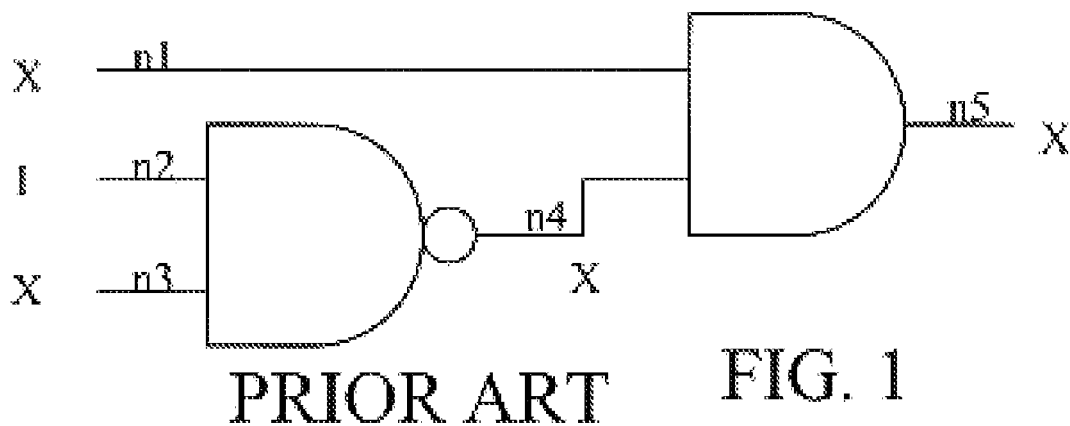
PRIOR ART    FIG. 1
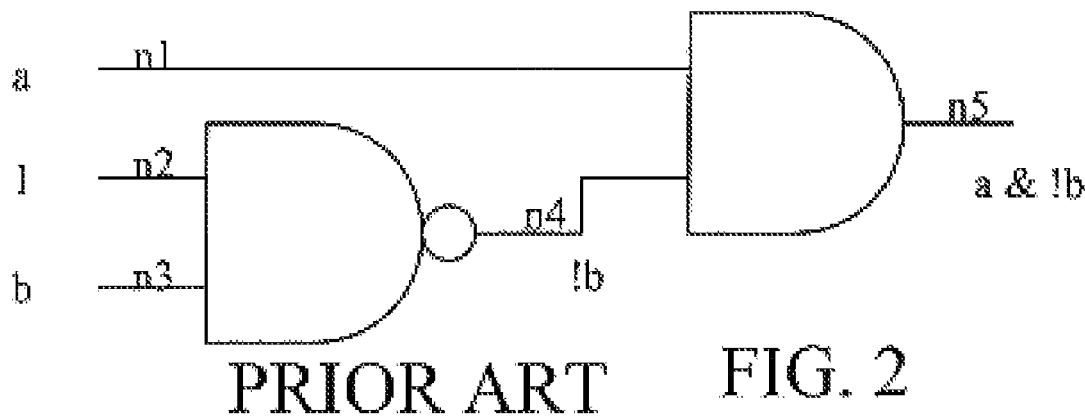
PRIOR ART    FIG. 2
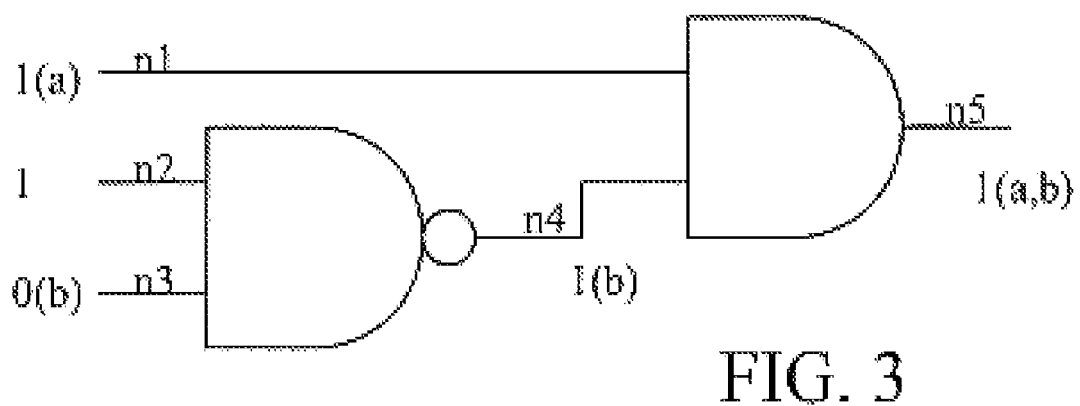
FIG. 3

SYSTEM FOR PERFORMING VERIFICATION OF LOGIC CIRCUITS

RELATED APPLICATION

This application is a divisional of U.S. Ser. No. 11/461,469 entitled Method for performing verification of logic circuits, filed Aug. 1, 2006 now U.S. Pat. No. 7,398,494 and claims priority from the application 05107941.6/EP05107941 filed Aug. 30, 2005.

1. BACKGROUND OF THE INVENTION

1.1. Field of the Invention

The present invention relates to a system for performing verification of logic circuits and a corresponding computer program product.

1.2. Description and Disadvantages of Prior Art

Digital logic circuits implement a logic function and represent the core of any computing processing unit. Thus, before a "logic design" is constructed in real hardware, it must be tested and the proper operation thereof has to be verified against a design specification. For example, this is done in prior art by simulating a so-called gate-level netlist. This gate-level netlist has a graph structure with Boolean gates as nets and nets as connecting arcs. Storage elements like latches can be built from Boolean gates and are commonly included as atomic latch instances in a gate-level netlist. In the following, we assume that a latch is included as an atomic latch instance in a gate-level netlist. Also, the abbreviated term "netlist" may be substituted for "gate-level netlist". This gate-level netlist is representing the respective sections of the desired hardware circuit.

Assume, a simple exemplary digital circuit has a plurality of 16 input bits. Then, a plurality of 2 to the power of 16=65536 different input settings exist, which should be tested in total for correct operation of the circuit, or its logic model, respectively. This is already a time-consuming work, either done by a computer, but at least surveyed in critical points within the circuit by the hardware developer engineering team. Thus, this way of hardware verification is called "exhaustive" functional verification.

Today's hardware designs, however, are much more complex than the before-mentioned simple 16-bit circuit. Even single sections of a hardware design may comprise hundreds, or several thousands of input variables.

This enormous input bit setting space cannot be verified in such exhaustive way, covering for example a plurality of (2 exp 2500) different input settings, i.e. "stimuli", and their correct propagation through the gate-level netlist. Thus, a so-called "biased, random" verification is done, selecting some bit settings only, the propagation of which seems to touch at least some of the "problematic zones" in a hardware design. Such selection might be to select an input bit pattern consisting of only "0", one of only "1", (corner cases), and some randomly selected patterns in-between them, comprising both values. There are also variations in that type of methods in prior art, like "walking 1s", etc.

In summary, the drawbacks of exhaustive functional verification are: The simulation runtime is very long due to an exhaustive set of stimuli. In many cases it is a time-consuming task to check that all possible combinations for example on a certain data path in a gate-level netlist are exercised, and that they work correctly.

A full (complete) checking is difficult to perform, since a logic function does not necessarily generate signal level changes, when for example, only one bit is changed in relation to the preceding input bit pattern. This is due to restrictions in the testbench, when registers are being set and reset, but there are only special combinations allowed (i.e. writing zeros to a register that shows already only zeros).

An alternative for doing exhaustive, bit value oriented, functional simulation is the prior art "symbolic" simulation, as schematically depicted in FIG. 2. Here, instead of bit values, symbols are propagated through the gate-level netlist. For example, a 2-input AND gate with input symbols "a" and "b" produces a result "a AND b". This short logic expression is then the input for another gate, thus, maybe "a AND b OR c" results after the next step in a selected path. A long path in the logic results in an expression of significant extent. If, further, some feedback loop connects between some net location and a preceding net location of the propagation path, such expression can easily "explode". This is a disadvantageous limitation of symbolic simulation or verification.

In summary, the drawbacks of "symbolic simulation" are: First, only small designs can be verified due to the possible expression explosion. Further, such expressions grow dynamically; therefore the simulation cannot be run on so-called hardware accelerators, i.e. on dedicated high-performance simulation servers. Further, as the symbols have no value, a regular, usual bit-value-based functional simulation cannot be carried out simultaneously, which is often strongly desired.

With reference to FIG. 1, prior art X-state simulation has only the anonymous indeterminate 'X', multi-value simulation may have more values between 0 and 1, for example 'Z', but all of them are anonymous. For X-state simulation, either plain 0/1 values or an 'X' are present at the circuit nets. Two different nets may carry an 'X', but a decision to set one 'X' to 0 does not mean that the other 'X' is set to 0 also. One only knows from the simulation if an indeterminate value 'X' may have an influence to some net or not, see FIG. 1 for an example circuit simulated with exemplary values.

A further prior art approach is disclosed in a yet unpublished patent application U.S. Ser. No. 11/009,350 of the Applicant. In this patent application a so-called "Colored-bits" simulation is dealing with the specific (but not determined) value at selected locations inside the gate-level netlist and their propagation through this netlist by the simulator. A value 0 at net 'n1' colored 'a' is in sync with a value 1 colored 'a' at another netlist location 'n2', i.e. if 'n1' would be 1, 'n2' would be 0.

By this colored-bits simulation, one can make sure that some colored values transported through the logic would have been transported also with other values in the same way. But as soon as two colored-values are involved in a logical function of the netlist and both have to be propagated on a single net, colored-bits simulation loose all advantages and can only propagate an anonymous crunched color, i.e. an indefinite or indeterminate color, which has lost its particular property to be exactly a single specific color.

1.3. Objectives of the Invention

It is thus an objective of the present invention to provide a method for verification of logic circuits, which adds a useful alternative in the field of functional, exhaustive simulation and of symbolic simulation.

2. SUMMARY AND ADVANTAGES OF THE INVENTION

This objective of the invention is achieved by the features stated in enclosed independent claims. Further advantageous arrangements and embodiments of the invention are set forth in the dependant claims. Reference should now be made to the appended claims.

According to a basic aspect of the invention a method for performing a verification of designed hardware logic circuits is disclosed, wherein the circuits comprise nets and gates and wherein output values are calculated for each gate dependent of a predetermined input bit setting; this method is characterized by the steps of:

a) marking a net with an additional property other than the bit value, both, bit value and additional property being valid at said net at a given time, b) propagating the marking of the net according to a set of predetermined semantic rules, wherein the rules are defined according to a predetermined simulation aim, c) generating an output at a predetermined downstream location of the circuit, said output providing an information, if or if not said property has propagated through the circuit to said predetermined circuit location.

The new simulation provides knowledge if a set of nets (attached with a color) may have any impact on other nets. Due to the fact that the simulation can use multiple colors, it can tell from where a net's value may be influenced. The most preferred simulation aim is to be sure that specific input nets do not influence a given evaluation node in the simulated circuit.

The method is referred to herein as "Colored-groups simulation" and uses plain 0/1 values at all nets, like regular 2-value simulation does. In addition to that, the values can be colored. To denote attached colors, they are listed herein as letters in parenthesis after the values 0/1. A group color value attached to a plain value 0/1 denotes an indeterminate change to that value. Two indeterminate changes 'a' at two nets are related, but not as strong as in full symbolic simulation, or colored-bit simulation. The difference is that a change at a net colored with 'a' may impact other nets colored with 'a'.

It is guaranteed by the colored-groups simulation semantics as described in detail further below that a change at a net colored 'a' does not have any impact on nets not colored with 'a'.

Considering the example circuit in FIG. 3 with input nets carrying colors 'a' and 'b', a change at input net 'n1' is guaranteed to have no impact on 'n4', as it does not carry the color 'a'. Both colors are attached to the value of output net 'n5', therefore a change at any of the colored inputs may result in a change at 'n5'.

Advantages Relative to Prior Art:

X-state simulation (see FIG. 1) can not tell which indeterminate input net property X influences a downstream net's value.

Full symbolic simulation can tell which symbol influences a net's value, and in addition specifies the exact effects by a Boolean formula. But the calculation may explode in time and/or memory requirements, such that this is only of limited value.

The Colored-groups simulation or verification method is faster than full symbolic simulation, and does not require a handling of dynamic data structures. The size requirements are fixed and known before simulation run-time. Therefore, the colored-groups simulation semantics can be implemented by a structural netlist enhancement.

A regular bit-level simulator as well as hardware accelerators can be used to carry out a colored-bits simulation. Full symbolic simulation requires dynamic handling of data structures. In the worst case, it has an exponential complexity.

X-state simulation can also be implemented as a structural netlist enhancement. Its simulation runtime and memory requirements are less than that of the colored-groups simulation. But the knowledge gained by the verification is limited.

In contrast to the US-patent application of the Applicant as cited and described above with reference to FIG. 2, a value 0 at net 'n1' group-colored 'a' is NOT in synchronization with a value 1 group-colored 'a' at another netlist location 'n2'; i.e. if 'n1' would be 1, this would NOT mean that 'n2' is 0. The relation in group-coloring is a lot weaker than in bit-coloring, any 2 locations in a netlist having the same group color have only a possible dependency. i.e., if 'n1' would be 1, then 'n2' MAY be 0.

By Colored-groups simulation, one can NOT make sure that some group-colored values transported through the logic would have been transported also with other values in the same way. The colored-group simulation can tell only that the initially colored values may have an impact on the values at the transport end-points, they may have been dropped, or inverted, or otherwise logically changed.

Colored-groups simulation can still show the dependency of a set of values independently of the complexity of the logical function involved, a colored-bit simulation according to the above cited patent application would require multiple colors for that purpose, which have been crunched in most logical functions and therefore would have lost their traceability.

Thus, as a person skilled in the art may appreciate, that Colored-groups simulation provides new gate-level netlist simulation semantics for related indeterminate values. The semantics can be explained best also by comparison to the full symbolic semantics.

The full symbolic simulation applies the logical function of a gate on the symbols/values at its input nets, and propagates the resulting formulas (after applying simplification techniques from time to time) further down the circuit. In contrast, the colored-groups simulation will not store the resulting formulas; it only stores (besides the plain value 0/1) the set of colors at the input of the formula. At this point, some tolerable degree of accuracy is lost, but the complexity is reduced and calculation speed is strongly increased.

3. BRIEF DESCRIPTION OF THE DRAWINGS

Figure 5:
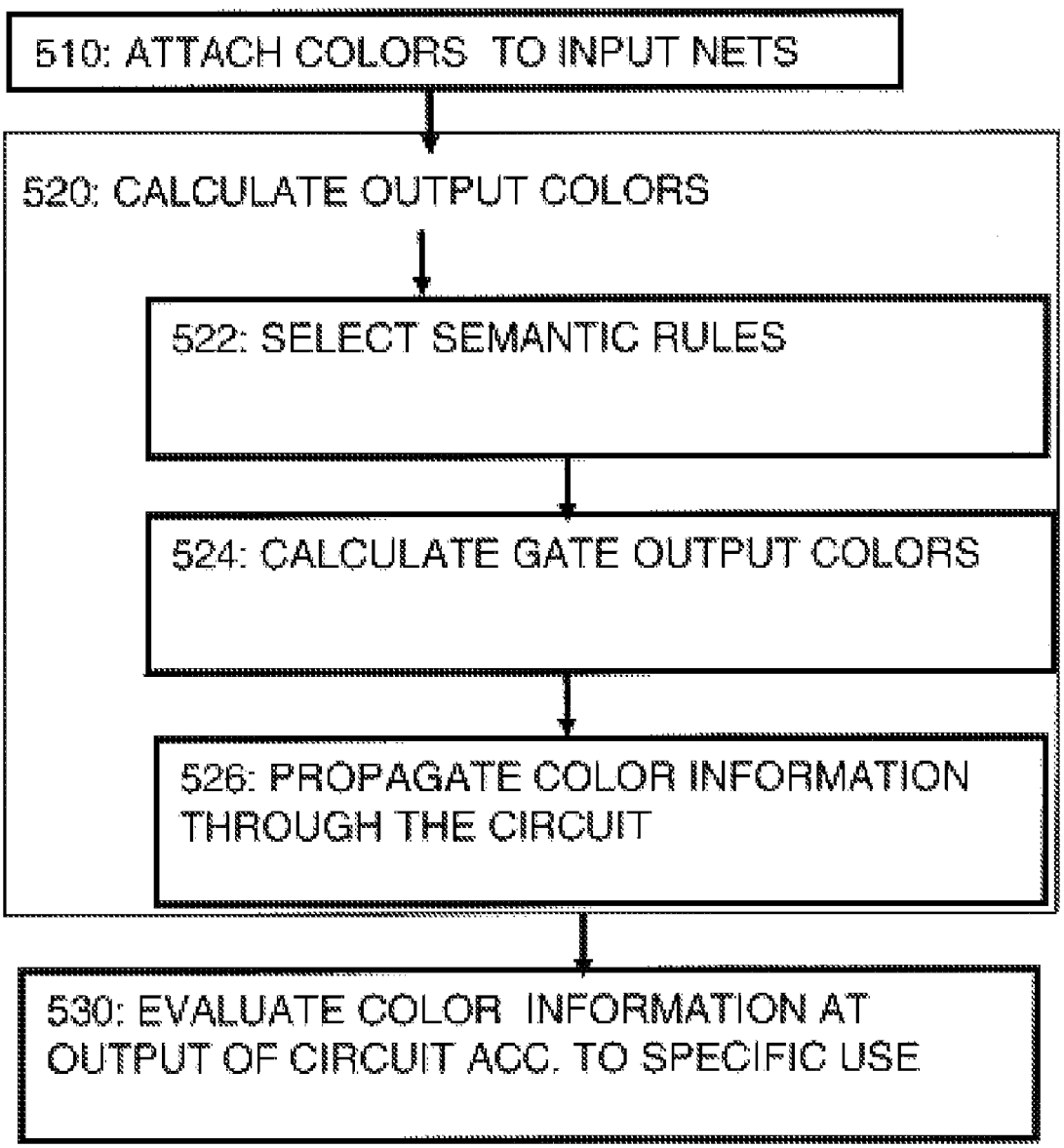

The present invention is illustrated by way of example and is not limited by the shape of the figures of the drawings in which:

FIG. 1 is a schematic circuit for illustrating the prior art X-state verification, FIG. 2 is a schematic circuit for illustrating the prior art symbolic verification, FIG. 3 is a schematic circuit for illustrating the "Colored groups" verification method, FIG. 4 is a schematic circuit for illustrating a method in accordance to the present invention for a particular exemplary circuit, FIG. 5 is a control flow diagram of a method in accordance to the present invention.

4. DETAILED DESCRIPTION OF THE PREFERRED EMBODIMENT

With general reference to the figures and with special reference now to FIGS. 3, 4 and 5 a description is given how a colored-groups simulation can be carried out according to a preferred embodiment of the present invention. It may be implemented, for example as an extension of a bit-level gate-netlist simulator enhancement in software, or as an enhancement of the input netlist to a standard bit-level gate-netlist simulator. The procedure is described first in a general way applicable for both applications. Further below, the particularities of either an extension of a software simulator or a netlist enhancement will be described in more detail.

The first main step 510 is to attach so-called "group-colors" to the plain bit values of all nets at the input of a gate, as depicted in FIG. 3 with the color attributes a and b at the left upper and left lower input net.

Simulation is the task of determining the output values for each gate according to the current input values. A bit-level gate-netlist simulator basically deals with plain bit values 0 or 1 present at all nets of the gate-netlist during simulation time. For the colored-groups simulation, additional information pieces are attached to the plain bit values 0 or 1, which information pieces are called 'group-colors'.

It should be noted that the colored-groups simulation method according to the invention is in principal not bound to a specific way to attach colors to a plain bit value. The only restriction is that the number of available colors has to be known before the simulation is carried out.

Nevertheless, two variants of attaching colors are given here for reference purposes, a binary and a one-hot encoding scheme.

a) The binary encoding scheme allows only a single group-color to be attached to a plain value at any time. When more than 1 group-color is used for the simulation, an additional 'crunched' group color is defined in the simulation. The crunched color is used to represent the case where multiple colors are to be attached to the plain value. This can be the result of the colored-groups simulation semantics.

The advantage of this variant is the logarithmic storage complexity O(log(N)) for attaching the colors, as a simple binary encoding of colors can be chosen. A disadvantage is the reduced information when multiple colors are substituted by the crunched color, see table 1 for two exemplary binary encodings.

b) The one-hot encoding scheme allows all defined group-colors to be attached to a plain value at any time. For this variant, no crunched color is needed. The advantage is that no information is lost as it would be the case for variant a). The disadvantage is the linear storage complexity for attaching the colors to the plain values of O(N), as either some kind of one-hot encoding or a list structure have to be chosen for the colors.

It should be added that a specific colored-groups simulation may chose a further encoding scheme different to the variants a) and b) described above, or can apply a mix of them. For example the simulation can allow to attach up to a fixed multiple (e.g. 2) of group-colors to a plain value, but still not all (e.g. 10) of the defined colors.

TABLE

Table 1: Two example binary encodings of group-colors

| Color | Binary encoding 1 | Binary encoding 2 |
|---|---|---|
| No-color | 000 | 00xxx |
| 'a' | 001 | 01000 |
| 'b' | 010 | 01001 |
| 'c' | 011 | 01010 |
| 'd' | 100 | 01011 |
| 'e' | 101 | 01101 |
| 'f' | 110 | 01110 |
| 'g' | — | 01110 |
| 'h' | — | 01111 |
| '?'/"crunched color" | 111 | 1xxxx |

As for all encoding schemes, when not enough attachment places are present for satisfying the storage need of all colors being defined in the simulation, a "crunched" color should be added to the known colors.

The second main step 520 is to calculate output colors of combinational gates with a specific semantic rule.

The group-color simulation semantics can be described by a group-color calculation rule on an arbitrary combinational gate. It is assumed that the ordering of the gate output color calculations strictly follow the sequence of the plain value output calculations. By this sequence, a Colored group simulation is capable of handling combinational gates which form feed-back paths whenever the original simulator would have been able to handle this.

Storage elements inside the gate-netlist are assumed to have a single input (vector) and a single output (vector) net. The output (vector) net simply holds the input (vector) value of the previous cycle. Any reset, enabling or priority functionality must have been implemented as external gates around the storage element. The Colored-groups simulation semantics are not dependent on the calculation of the initialization values for the storage elements. This is a matter of the circuit design and related physical properties of the storage elements.

Let us define the set of available colors in a simulation run as C, with the group-colors represented as lowercase letters 'a', 'b', . . . and the crunched color as '?'. For example, if we have five colors available in a simulation and we chose a one-hot encoding, then it yields:

$$C=\{a, b, c, d, e\}$$

Let us define an input of a gate as xi with the subscript i denoting the i-th input of the gate. Contained in xi is the plain value as well as the set of attached colors.

Thus x3 for example: x3=0(a,b,d,e)

Let us define further in a semantic rule selection step 522:
v(xi) as returning the plain value of xi,
c(xi) as returning the list of colors attached to xi, and
p(xi) as returning true only if no colors are attached to xi.

The vector of all inputs is X, the function of a gate is represented as f(X). For example, considering the example circuit from FIG. 3, the gate function is:

$$f(X)=x1\&!(x2\&x3)$$

It should be noted that any Boolean formula can be transformed into a Boolean formula containing a combination of the only logic elements of binary AND '&' and the negation '!'. This transformation holds also for any gate function in a Colored-groups enabled simulation. The Colored-groups calculation rule needs therefore only be defined for a 2-input AND gate and a negation. The Colored-groups output of any Boolean formula can then be calculated by successively applying the Colored-groups calculation rule for a 2-input AND or a negation according to the regular Boolean operator precedence and given parenthesis.

Using the above definitions for the negation and 2-input AND, a preferred semantic rule will be defined as described next below:

First, a preferred Colored-groups calculation rule will be defined for a negation. The rule can be defined by separate rules on v(xi) and c(xi). Although p(xi) can be calculated from c(xi), a separate rule is given for it here:

$$v(!xi)=!v(xi)$$

$$c(!xi)=c(xi)$$

$$p(!xi)=p(xi)$$

Effectively, only the plain value (0 or 1) will be affected by the negation.

Second, a preferred calculation rule will be defined for a 2-input AND. The value aspect shows the expected result as known for plain Boolean values:

$$v(xi\&xj)=v(xi)\&v(xj)$$

The calculation of c(xi & xj) depends on the following conditions:
a) p(xi) & !v(xi)
b) p(xj) & !v(xj)
c) i==j & (v(xi) !=v(xj))

If any of them hold, c(xi & xj) is the empty set $$c(xi\&xj)=\{\ \} \quad (1)$$

otherwise it is the union set of both input sets:

$$c(xi\&xj)=c(xi) U c(xj) \quad (2)$$

The aspect p(xi & xj) is 1 if no elements are in c(xi & xj) and 0 otherwise.

Next a calculation example for calculating gate output colors is given for the above defined rules, see step 524:

We use the exemplary formula $$f(X)=x1\&!(x2\&x3)$$

and the following exemplary input values and color attachments to demonstrate the calculation rules:

$$v(x1)=1$$

$$c(x1)=\{a\}$$

$$p(x1)=0$$

$$v(x2)=1$$

$$c(x2)=\{\ \}$$

$$p(x2)=1$$

$$v(x3)=0$$

$$c(x3)=\{b\}$$

$$p(x3)=0$$

First, the different aspects of the sub term (x2 & x3) are calculated by choosing the general rule (2) for c(x2 & x3), which evaluates to $\{b\}=\{\ \} U \{b\}$:

$$v(x2\&x3)=0$$

$$c(x2\&x3)=\{b\}$$

$$p(x2\&x3)=0$$

The negation !(x2 & x3) accounts only for a changed value aspect:

$$v(!(x2\&x3))=1$$

$$c(!(x2\&x3))=\{b\}$$

$$p(!(x2\&x3))=0$$

The last step again involves general rule(2):

$$v(x1\&!(x2\&x3))=1$$

$$c(x1\&!(x2\&x3))=\{a,b\}$$

$$p(x1\&!(x2\&x3))=0$$

Next, the complexity of gate-level functions will be taken in consideration. The above calculations are carried out for each Boolean gate formula during a propagation step 526 without any substitution of multiple colors by the crunched color. Substitution takes place only after a gate is processed completely. If a substitution is to be done depends on the number of colors which can be attached to a plain value, see above as described in step 510.

The condition c) i==j & (v(xi) !=v(xj)) as described above can simplify the calculation only if both operands are actually from the same input of the gate (index i and j are the same). This is useful for a multiplexer which is typically modelled as a NAND implementation:

$$f(X)=!(!(x1\&x2)\&!(!x1\&x3))$$

Assume this is treated as a single gate inside the colored-groups calculation of the simulator and both data inputs x2 and x3 are 1. The formula then evaluates to:

$$f(X)=!(!(x1)\&!(!x1))$$

and then to $$f(X)=!(!x1\&x1)$$

where above condition c) i==j & (v(xi) !=v(xj)) applies and yields:

$$c(!(!x1\&x1))=\{\ \}$$

regardless of c(x1).

If this multiplexer had been treated as separate gates, the last step would have seen different inputs and condition
c) i==j & (v(xi) !=v(xj))

could not applied; thus the simulation would have given a more pessimistic result in respect to group-color propagation through the netlist.

Finally, in step 530, the selected output node is calculated to carry a certain list of colors. These colors can now be evaluated in step 530 according to the evaluation aim as defined above, principally for the purpose of excluding the influence of partial nets on the result of the evaluation node.

Next, the Colored-groups simulation method is described in regard to an implementation of a sofware enhancement of a bit-level gate-netlist software simulator.

Colored-groups simulation semantics can be implemented by an enhancement in software of a bit-level gate-netlist software simulator. The enhancement basically comprises the following steps:

1. Adding the color information c(xi) to any plain value already stored in the simulator. Any implementation must decide on the encoding of the colors in these additional storage places, see step 510 above.

2. Also implementing the color information for any basic gate for which the software simulator is calculating a plain value. The above calculation rules for negation and a 2-input AND are sufficient to calculate the color output for any Boolean gate. Depending on the encoding chosen, an optional substitution of multiple colors by the crunched color should be done before passing the color output value to the next basic gate, or before saving the color output.

Next, and with reference to FIG. 4, the Colored-groups simulation method is described in regard to a gate-netlist enhancement.

The Colored-groups simulation semantics can be implemented by an enhancement of the input netlist to a bit-level gate-netlist simulator. The way the simulator is implemented does not matter here, as the colored-groups simulation semantics are completely coded into the input netlist.

The netlist enhancement will primarily comprise:

1. Adding a number of additional nets to any original net in the netlist in order to store the color information $c(x_i)$ during the simulation run. Any implementation must decide on the encoding of the colors in these additional nets.

2. Adding to any basic gate in the netlist a color calculation gate-netlist for calculating the color information. The calculation rules for negation and a 2-input AND are sufficient to calculate the color output for any Boolean gate. It should be noted that no additional gate-netlist must be inserted for a negation, as the necessary calculation is already covered by the original gate.

Depending on the encoding chosen, an optional substitution gate-netlist must be inserted to transform multiple colors into a crunched color. Of course, any simulation control program must understand the semantics of the additional nets to correctly set and read the color information of the simulation run. The advantage of enhancing the netlist is that a range of simulators can be used once the enhanced netlist is created. This includes hardware accelerators, which generally yield best results when simulating a bit-level gate-netlist.

The encoding for this example is chosen to be a one-hot encoding using two bits, thus two group colors are available and can be stored at any net at the same time. A respective circuit scheme is depicted in FIG. 4.

This FIG. 4 shows an exemplary netlist enhancement for a 2-input AND gate. The original gate is 'I_original' with plain input nets 'A' and 'B' and output 'Y'. The netlist enhancement added for each original net 'A', 'B' and 'Y' their '_CC(0)' and '_CC(1)' variants to store the color information.

To calculate these colors, gates 11 to 17 are inserted. The three regions R1, R2 and R3 are taking over the following calculations:

R1 is calculating the conditions a) and b) above.
R2 is calculating the union of colors (see equation (2)).
R3 is clearing the colors from R2 if conditions a) or b) hold.

It should be noted that every bit-level gate-netlist can be enhanced using this basic enhancement step as every Boolean function can be represented as negation and 2-input ANDs.

Finally, an LBIST (logic built-in-self-test) verification application example is given. The problem of the LBIST verification is to ensure that the LBIST signature is not influenced by so-called 'free-running' logic which does not directly participate in the LBIST.

Usually parts of the 'free-running' logic do have an impact on the LBIST results. The method to identify these logic sources is mostly handcrafted, cumbersome analysis of X-state simulation results, trying to back-trace 'X' values through the netlist. Once the set of participating logic is found, every possible value set is to be analyzed, and it must be verified that these values have no real impact on the LBIST signature. For complexity reasons, it's crucial to keep this logic set as minimal as possible.

By Colored-groups simulation in one-hot encoding, it is possible to build an algorithm finding this minimal set of contributing logic in a fully automatic way.

Let us define the set of possibly contributing nets as $P=\{p_1, p_2, \ldots, p_J\}$, the set of nets which are allowed to contribute as O, and the set of LBIST signature nets as S.

The set of available colors in the simulation is $C=\{c_1, c_2, \ldots, c_L\}$, and let us define an assignment of colors to contributing nets as $A=\{a_1, a_2, \ldots, a_L\}$ with each element al as a subset of P. That means that only possibly contributing nets (P) get a color assigned.

No net pj is in two sets al at the same time. The color assigned to nets in al is cl. For example, the nets in a3 get assigned the group color c3. The set $Z=\{c_1, c_2, \ldots, c_M\}$ should be the set of colors found after simulation at the signature nets S.

A function 'newAssign' takes a set of nets as input and generates an assignment A of the available colors C to these nets. This function can be made smart in deciding which colors should be assigned to which nets, but it will require knowledge for example about used naming conventions in the logic to guess a function of a net from its name.

Nevertheless the algorithm works also with a greedy implementation of 'newAssign', which equally distributes the colors to the input nets in a round robin fashion as far as nets of the input set still do not have colors assigned.

A Colored-groups simulation 'run' takes A as input and calculates Z. The following is a simple recursive algorithm to find the minimal set of P called Pmin. The algorithm basically consists of a central function 'doSim'. Not shown is a helper function 'ithHalfOfSet', which takes a set as its first argument, and simply returns either the first half of the set or the second half of the set, depending on the second argument being a 0 or 1.

Let $\in$ denote the relation "is element of" from the mathematical set theory, 'Set_1 U Set_2' denote the union of the sets Set_1 and Set_2, and 'Set_1\Set_2' denote the set that results from deleting the set Set_2 from the set Set_1, then the algorithm is defined as follows:

```
FUNCTION doSim(Parg) DO
    IF cardinality(Parg) = 0 THEN
        // nothing more to do
        RETURN
    ENDIF
    A := newAssign(Parg)
    Z := run(A)
    VAR split := false
    FORALL al ∈ A DO
        IF color(al) ∈ Z THEN
            //At least one net in nets(a1) may influence the signature
            IF cardinality(nets(a1)) = 1 THEN
                // Definite influence of net, move nets(al) into Pmin
                Pmin := Pmin U nets(al)
                Parg := Parg \ nets(al)
            ELSE
                split := true
            ENDIF
        ELSE
            // No influence of all nets a
            Parg := Parg \ nets(al)
        ENDIF
    ENDFORALL
    IF split = true THEN
        // Divide and conquer
        doSim (ithHalfOfSet (Parg, 0))
        doSim (ithHalfOfSet (Parg, 1))
```

```
        ELSE
            doSim Parg
        ENDIF
ENDFUNCTION
```

The recursive function needs to be called with the initial set of nets possibly contributing to the LBIST signature nets, which is calculated by all nets (N) without the signature nets (S) and the set of nets which are allowed to contribute (O):

P:=N\(S U O)
doSim(P)

After the recursive function doSim has returned, the results are stored in the global set Pmin.

The present invention can be realized in hardware, software, or a combination of hardware and software. A verification tool according to the present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after either or both of the following
a) conversion to another language, code or notation;
b) reproduction in a different material form.

The invention claimed is:

1. A computer system for performing a verification of a logic circuit, wherein the logic circuit comprises nets and gates and wherein output values are calculated for each gate dependent on a predetermined input bit setting, the computer system having
   a) means for marking a net with an additional property other than a bit value, wherein both said bit value and said additional property being valid at said net at a given time;
   b) means for propagating the marking of said net according to a set of predetermined semantic rules, wherein the set of predetermined semantic rules is defined according to a predetermined simulation aim; and
   c) means for generating an output at a predetermined downstream location of the logic circuit, wherein said output provides an indication regarding whether said additional property has propagated through the logic circuit to said predetermined downstream location or not.

2. A computer program code, when executed on a computer in a data processing system, performing steps of verification of a logic circuit, which comprises nets and gates, the steps comprising:
   a) marking a net with an additional property other than a bit value, wherein both said bit value and said additional property being valid at said net at a given time;
   b) propagating the marking of said net according to a set of predetermined semantic rules, wherein the set of predetermined semantic rules is defined according to a predetermined simulation aim; and
   c) generating an output at a predetermined downstream location of the logic circuit, wherein said output provides an indication regarding whether said additional property has propagated through the logic circuit to said predetermined downstream location or not.

3. A computer program product stored on a computer usable medium comprising computer readable program means for causing a computer to perform the steps of:
   a) marking a net in a logic circuit with an additional property other than a bit value, wherein both said bit value and said additional property are valid at said net at a given time;
   b) propagating the marking of said net according to a set of predetermined semantic rules, wherein the set of predetermined semantic rules being defined according to a predetermined simulation aim; and
   c) generating an output at a predetermined downstream location of the logic circuit, wherein said output provides an indication regarding whether said additional property has propagated through the logic circuit to said predetermined downstream location or not.

* * * * *